United States Patent [19]

Tsukada et al.

[11] 4,399,016

[45] Aug. 16, 1983

[54] PLASMA DEVICE COMPRISING AN INTERMEDIATE ELECTRODE OUT OF CONTACT WITH A HIGH FREQUENCY ELECTRODE TO INDUCE ELECTROSTATIC ATTRACTION

[75] Inventors: Tsutomu Tsukada; Hideo Takei, both of Tokyo, Japan

[73] Assignee: Anelva Corporation, Tokyo, Japan

[21] Appl. No.: 357,216

[22] Filed: Mar. 11, 1982

[30] Foreign Application Priority Data

Mar. 12, 1981 [JP] Japan ................... 56-35741

[51] Int. Cl.$^3$ ............................................. C23C 15/00
[52] U.S. Cl. ............................ 204/192 R; 118/723; 156/345; 156/643; 204/164; 204/298
[58] Field of Search ............................ 156/345, 643; 204/192 E, 298, 164; 118/723

[56] References Cited

U.S. PATENT DOCUMENTS 4,252,626 2/1981 Wright et al. .................. 204/192 R
4,279,216 7/1981 Buhl et al. ........................ 204/298

Primary Examiner—Arthur P. Demers
Attorney, Agent, or Firm—Laff, Whitesel, Conte & Saret

[57] ABSTRACT

In a support member for supporting a sample processed in a hollow space between first and second electrodes between which a high frequency a.c. voltage is supplied to produce plasma in the hollow space, a conductor is laid on the first electrode with a first dielectric layer interposed therebetween and is covered with a second dielectric layer to be attached to the sample. A d.c. voltage source is connected through the first dielectric layer out of contact with the first electrode to induce electrostatic attraction during production of the plasma and, thereby, to fixedly attach the sample to the second dielectric layer. A temperature control member is embedded in the first electrode to control a temperature of the sample. The control member may be a cooling member or a heater. A plurality of the support members may be located on the first electrode. Preferably, the first and the second dielectric layers are of epoxy resin and polyimide resin, respectively.

14 Claims, 3 Drawing Figures

PLASMA DEVICE COMPRISING AN INTERMEDIATE ELECTRODE OUT OF CONTACT WITH A HIGH FREQUENCY ELECTRODE TO INDUCE ELECTROSTATIC ATTRACTION

BACKGROUND OF THE INVENTION

This invention relates to a plasma device for processing a sample or samples by the use of plasma.

As a plasma device of the type described, a dry etching device has been used which comprises a pair of flat electrodes located in parallel to each other in a hollow space. During etching, an a.c. voltage of a high frequency more than several tens of kiloherz is usually supplied from an a.c. voltage source to the electrode pair to produce plasma in the hollow space between the electrode pair. Such a dry etching device is indispensable to a very large scale integration technique because it is possible for the dry etching device to delineate five patterns on a sample, such as a semiconductor wafer. It is mentioned here that the dry etching device is loaded with the sample selectively covered with a resist layer having resist patterns and lends itself to transcribe the resist patterns to the sample so as to leave the five patterns on the sample.

Such a resist layer is poor in thermal stability and is, therefore, susceptible to thermal damage by bombardment of electrons and the like. When the resist layer is subjected to the thermal damage, precise transcription of the resist patterns becomes difficult. As known in the art, it is necessary to augment high frequency electric power of the a.c. voltage source in order to raise an etch rate in the dry etching device. With augmentation of the high frequency electric power, the thermal damage of the resist layer becomes more serious.

It has been pointed out that a sample support, such as one of the electrode pair, may be cooled during etching to reduce a temperature of the sample and to alleviate the thermal damage of the resist layer. To this end, the sample should fixedly or firmly be brought into contact with the sample support. However, it is not always easy to fixedly bring the sample, for example, the wafer into contact with the sample support because the wafer is thin and very light. In addition, conduction of heat is not good enough in an atmosphere of a low pressure gas in the hollow space. The wafer is, therefore, not preferably cooled in the hollow space kept at a low pressure.

In order to fully cool the wafer, it is necessary to snugly attach the wafer to the sample support. For this purpose, the wafer has usually been pressed to the sample support by the use of clamps or weights. An arrangement of the clamps or weights results in partial disturbance of plasma during etching. The wafer is not uniformly processed by the disturbance of the plasma. In addition, provision should be made of a number of the clamps or weights when a plurality of the samples are concurrently processed. Thus, use of the clamps or weights is not suitable for processing a lot of the samples.

In another way, grease has been coated on the rear surface of each sample to attach each sample to the sample support. Use of the grease, however, gives rise to contamination of the sample because the grease is spread over a boundary of the sample.

Alternatively, a dry etching device disclosed in Japanese Pre-patent Publication or Published Unexamined Patent Application No. Syô 55-90228, namely, 90228/80 fixedly attaches a sample to a sample support by the use of electrostatic attraction, as will later be described with reference to one of a few figures of the accompanying drawing. More particularly, the sample support comprises a particular one of electrode pair supplied with a high frequency a.c. voltage and a support member on the particular electrode. The particular electrode may be called a high frequency electrode. The support member comprises a dielectric layer brought into contact with the sample. The particular electrode is supplied with a d.c. voltage in superposition on the high frequency a.c. voltage. In this structure, the electrostatic attraction results from interactions of the d.c. voltage and a self-bias voltage occurring during production of the plasma. As a result, the sample is attracted to the particular electrode by the electrostatic attraction and is desirably cooled by a coolant flowing through the particular electrode. Therefore, the sample is fixedly held on the electrode without any thermal damage.

With the above-mentioned dry etching device, the d.c. voltage is superposed on the high frequency a.c. voltage on the particular or high frequency electrode. This means that the plasma causes electrical charges to flow from the particular electrode into a d.c. voltage source when the high frequency electrode is unexpectedly exposed to the plasma. At times, the electrical charges bring about a reduction or extinction of the electrostatic attraction and a destruction of the d.c. voltage source. Exposure of the high frequency electrode may give rise to variation of a plasma potential and to unusual discharge. Thus, etching is adversely affected by the variation of the plasma potential and the unusual discharge. In addition, the etching device should be handled with a great care because a coolant, such as water, is not isolated from the d.c. voltage source.

At any rate, it is difficult for the conventional plasma devices to concurrently process a plurality of samples at a high etch rate.

SUMMARY OF THE INVENTION

It is an object of this invention to provide a plasma device for processing a sample by the use of plasma, which is capable of fixedly holding the sample by electrostatic attraction to favorably cool the sample during processing.

It is another object of this invention to provide a plasma device of the type described, which is capable of being readily handled without great care.

It is another object of this invention to provide a plasma device of the type described, which can simultaneously and uniformly process a plurality of samples.

It is yet another object of this invention to provide a plasma device of the type described, which substantially fails to give rise to unusual discharge and any variation of a plasma potential.

It is still another object of this invention to provide a plasma device of the type described, which can readily be coupled to an intricate mechanism for rotating an electrode and/or for feeding the sample.

A plasma device to which this invention is applicable is for processing a sample by the use of plasma. The device comprises a chamber defining a hollow space therein, a first flat electrode member placed in the hollow space and having a first electrode surface, a second flat electrode member placed in the hollow space and having a second electrode surface directed towards the first electrode surface, support means having a first support surface to be brought into contact with the first electrode surface and a second support surface directed towards the second electrode surface for supporting the sample on the second support surface, a.c. voltage providing means for providing an a.c. voltage between the first and the second electrode members to produce the plasma between the first electrode member with the support means and the second electrode member, d.c. voltage producing means for producing d.c. voltage to electrostatically couple the sample to the support means during production of the plasma and thereby to fixedly attach the sample to the second support surface. According to this invention, the support means comprises a first dielectric layer defining the first support surface, a conductor placed on the first dielectric layer out of contact with the first electrode surface and electrically connected to the d.c. voltage producing means, with the first electrode member electrically insulated from the d.c. voltage producing means, and a second dielectric layer covered on the conductor and defining the second support surface to which the sample is to be attached.

DESCRIPTION OF THE PREFERRED EMBODIMENTS

Figure 1:
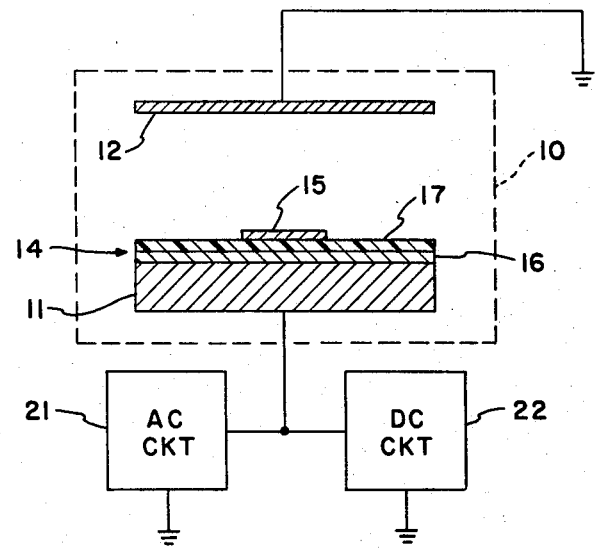
FIG. 1 schematically shows an axial sectional view of a conventional plasma device.

Referring to FIG. 1, a conventional plasma device will be described for a better understanding of this invention. FIG. 1 is a substantial reproduction of FIG. 1 in Japanese Pre-patent Publication No. 90228/1980 cited hereinabove.

The conventional plasma device is operable as a dry etching device, especially, a reactive sputter etching device. The plasma device comprises a chamber 10 defining a hollow space therein and first and second flat electrode members 11 and 12 opposite to each other in the hollow space. The first electrode member 11 has a first electrode surface directed upwardly of this figure. The second electrode member 12 is grounded and has a second electrode surface directed towards the first electrode surface. A support member 14 has a first support surface attached to the first electrode surface and a second support surface directed towards the second electrode surface. A sample or wafer 15 is supported on the second support surface of the support member 14.

The illustrated support member 14 comprises a conductive layer 16 brought into electrical contact with the first electrode surface and a dielectric layer 17 laid on the conductive layer 16. The conductive layer 16 defines the first support surface on the bottom surface thereof while the dielectric layer 17, the second support surface on the upper surface of the dielectric layer 17.

An a.c. circuit 21 is connected between the first and the second electrode members 11 and 12 to provide an a.c. voltage of a high frequency more than several tens of kiloherz. The a.c. voltage and the first electrode member may be referred to as a high frequency voltage and a high frequency electrode, respectively. A d.c. circuit 22 is also connected between the first and the second electrode members 11 and 12 to provide a d.c. voltage therebetween. A cooling member (not shown in this figure) is embedded in the first electrode member 11 to cause a coolant, such as water, to flow through the cooling member and to cool the sample 15 on the support member 14.

When the high frequency voltage is supplied between the first and the second electrode members 11 and 12, glow discharge, which is accompanied by plasma, takes place in the hollow space between the first electrode member 11 with the support member 14 and the second electrode member 12. As a result, the sample 15 is etched or processed by the plasma.

With the dry etching device, the second support surface, namely, the upper surface of the dielectric layer 17 is kept along with the sample 15 at a negative electric potential by electric charge induced by the plasma. On the other hand, the lower surface of the dielectric layer 17 is held at a positive electric potential determined by the d.c. voltage. Thus, electrostatic attraction occurs during production of the plasma between the sample 15 and the support member 14. The sample 5 is, therefore, fixedly attached to the support member 14 by the electrostatic attraction.

The etching device is, however, disadvantageous as pointed out in the preamble of the instant specification.

In addition, it is a recent trend that each of the first and the second electrode members 11 and 12 becomes broad more and more to process a lot of samples at the same time. Further, the first electrode member 11 is lately combined with an intricate mechanism for rotating the first electrode member 11 and/or for automatically feeding the sample 15 onto the first electrode member 11.

When the dry etching device illustrated in FIG. 1 is for use in combination with the broad electrode member and the intricate mechanism, a whole surface of the broad electrode member should completely be coated with a dielectric layer. Moreover, the dielectric layer should be excellent in its characteristic. In practice, it is difficult to completely coat the whole surface of the broad electrode member with such an excellent dielectric layer.

Figure 2:
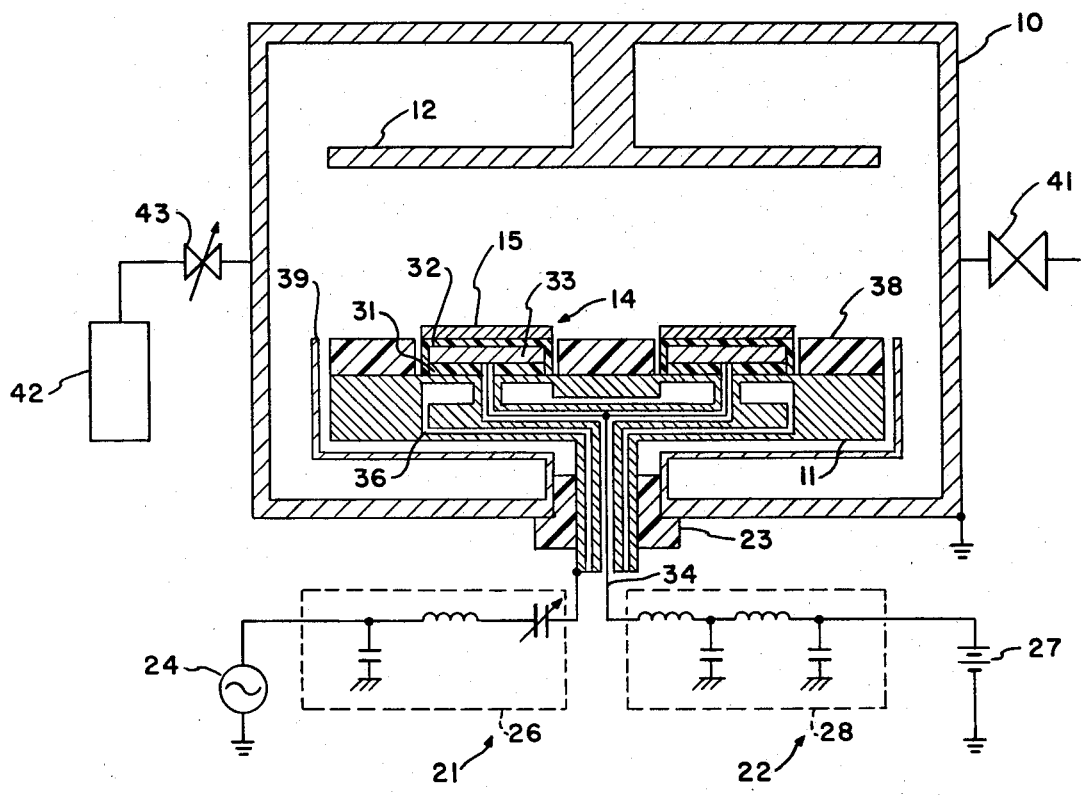
FIG. 2 shows a similar view of a plasma device according to a preferred embodiment of this invention.

Referring to FIG. 2, a plasma device according to a preferred embodiment of this invention comprises similar parts designated by like reference numerals and is operable as a reactive sputter etching device. More specifically, the first and the second flat electrode members 11 and 12 are located in the chamber 10 with the first and the second electrode surfaces opposite to each other. The first electrode member 11 is electrically insulated by an insulator 23 from the chamber 10 which is grounded along with the second electrode member 12. The a.c. circuit 21 is connected to the first electrode member 11, as is the case with the plasma device illustrated in FIG. 1. However, it should be noted here that the d.c. circuit 22 is electrically insulated from the first electrode member 11, as will later be described.

The a.c. circuit 21 comprises an a.c. power source 24 for producing the a.c. voltage of the high frequency and a matching circuit 26 for matching an impedance between the a.c. voltage source 24 and the first electrode member 11. The d.c. circuit 22 comprises a d.c. voltage power source 27 for producing a d.c. voltage and a filter 28 for rejecting a high frequency signal which unpleasingly leaks from the a.c. voltage source circuit 21 to the d.c. voltage source circuit 22.

The illustrated dry etching device comprises a plurality of support members 14 on the first electrode member 11 to support samples 15, respectively.

Each of the support members 14 has a first support surface attached to the first electrode surface and a second support surface directed towards the second electrode surface. Each sample 15 is positioned on the second support surface and is substantially equal in size to the second support surface. As a result, the second support surface is not substantially exposed to the hollow space on positioning each sample.

In FIG. 2, each support member 14 comprises a first dielectric layer 31 defining the first support surface, a second dielectric layer 32 defining the second support surface, and a conductor 33 completely covered with the first and the second dielectric layers 31 and 32. The conductor 33 is intermediate between the first and the second electrode members 11 and 12 and may, therefore, be called an intermediate electrode. In the example being illustrated, the first dielectric layer 31 is of an adhesive of epoxy resin including alumina as a filler while the second dielectric layer 32 is of polyimide resin.

The conductor or intermediate electrode 33 is electrically connected to the d.c. circuit 22 through a lead 34 out of contact with the first electrode member 11. For this purpose, a passage is laid internally of the first electrode member 11 and extended to the conductor 33 through the first dielectric layer 31. The passage lends itself to insulate the lead 34 from the first electrode member 11 and to connect the lead 34 to the conductor 33.

In the first electrode member 11, a conduit 36 is buried and extended to allow a predetermined coolant, such as water, to flow therethrough. The conduit 36 is electrically insulated from the d.c. circuit 22. Thus, the first electrode member 11 is forcibly cooled by the coolant flowing through the conduit 36.

An electrode cover 38 is placed on the first electrode surface uncovered with the support members 14. The electrode cover 38 serves to improve an etching characteristic, as known in the art. Within the chamber 10, a shield plate 39 encompasses a peripheral surface and a rear surface of the first electrode member 11 with the shield plate 39 electrically insulated from the first electrode member 11 by the insulator 34. The shield plate 39 is grounded together with the chamber 10 and serves to prevent any unnecessary plasma from occurring on unexpected surfaces, such as the peripheral and the rear surfaces.

Coupled to the chamber 10, a valve 41 is followed by a diffusion pump and/or a rotary pump (not shown). A combination of the valve 41 and the pump or pumps is operable as an exhausting system for exhausting the hollow space. A gas reservoir 42 is also coupled to the chamber 10 through a mass flow controller or valve 43 to introduce an etching gas into the hollow space. The etching gas may be carbon tetrafluoride or vapor of carbon tetrachloride.

In operation, each sample 15 is positioned on the second support surface of each support member 14. The hollow space is exhausted by the use of the exhausting system through the valve 41 and is, thereafter, filled to a predetermined pressure with the etching gas introduced from the gas reservoir 42 through the mass flow controller 43. Under the circumstances, the a.c. power source 24 is energized to supply the a.c. voltage between the first and the second electrode members 11 and 12. Supply of the high frequency a.c. voltage results in glow discharge between the first and the second electrode members 11 and 12. The samples 15 are etched or processed by the plasma in a well-known manner. At this time, a negative self-bias voltage is automatically induced on each sample 15 during production of the plasma. Therefore, each sample 15 is kept at a negative electric potential.

On the other hand, a positive d.c. voltage is impressed on the conductor or intermediate electrode 33 through the filter 28 and the lead 34 from the d.c. power source 27, as shown in FIG. 2, to keep the conductor 33 at a positive electric potential. As is the case with the device illustrated in FIG. 1, electrostatic attraction occurs through the second dielectric layer 32 between the samples 15 and the conductors 33. Each of the samples 15 is attracted to the second dielectric layer 32 by the electrostatic attraction and is firmly supported on the first electrode member 11.

The first electrode member 11 is cooled, during etching, by the coolant passing through the conduit 36 embedded in the first electrode member 11. Hence, it is possible with the plasma device to cool the first electrode member 11 with each sample 15 firmly supported on the first electrode member 11. This means that the plasma device can conveniently suppress a temperature rise of the samples and avoid thermal damage of a resist layer covered on each sample 15.

As shown in FIG. 2, the sample 15 is positioned on the support member 14 partially located on the first electrode member 11. The conductor 33 is not brought into contact with the first electrode member 11 and is insulated from the a.c. voltage source 24. In this structure, no d.c. voltage is superposed on the a.c. voltage impressed on the first electrode member 11. Accordingly, use is possible of an intricate mechanism for rotating the first electrode member 11 and/or for automatically feeding each sample 15 onto the support member 14, if the lead 34 is electrically completely insulated from the first electrode member 11. In addition, each of the first and the second electrode members 11 and 12 may be broad and may be complicated in configuration. At any rate, consideration is scarcely necessary about insulation between the plasma and the first electrode member 11.

The first dielectric layer 31 should be excellent in electrical insulation and in thermal conduction. In this viewpoint, the exemplified adhesive layer of epoxy resin including alumina is favorable and feasible. A paint layer of epoxy resin may be coated on the conductor 33 as the first dielectric layer.

The second dielectric layer 32 should have high permittivity and a thin thickness to effectively induce the electrostatic attraction, in addition to excellent insulation and thermal conduction. Preferably, the thickness of the second dielectric layer 32 is between several tens of microns and one hundred microns.

The sample 15 is not always positioned on every one of the support members 14. In this case, the second dielectric layer 32 is inevitably exposed to the plasma on etching. In view of this facts, the second dielectric layer 32 should sufficiently withstand bombardment of the plasma to avoid objectionable etching which, otherwise, takes place on the second dielectric layer 32. The second dielectric layer 32 should not have any pin holes or the like at which the dielectric breakdown readily occurs.

Furthermore, it is necessary for the second dielectric layer 32 to have enough mechanical strength and flatness. Contamination of the samples 15 should be avoided even when the second dielectric layer 32 is etched and vaporized in the hollow space. Substitution of the second dielectric layer 32 must be possible on contamination or degradation of the second dielectric layer.

Under a wide variety of the above-mentioned requirements, the polyimide resin is selected as a material of the second dielectric layer 32 in the illustrated device. The polyimide resin may be either an adhesive or paint. The polyimide resin may include a filler.

It has been confirmed that, instead of the polyimide resin, use is possible of high molecular paint or adhesive of silicone rubber or epoxy resin. Each of the paint and the adhesive may include a filler.

A film of a pressure sensitive adhesive may be attached to a high molecular layer to provide the second support surface. A combination of the pressure sensitive film and the high molecular layer serves as the second dielectric layer.

The first and the second dielectric layer may consist of a single material, such as a ceramic material, glass, plastics, or the like. A metal sheet, which serves as the conductor 33, may be coated with any metal oxide layer by the use of plasma spray method. The support member 14 may be manufactured by coating a sheet of a metal with an oxide layer of the metal by the use of anodic oxidation, or the like.

Figure 3:
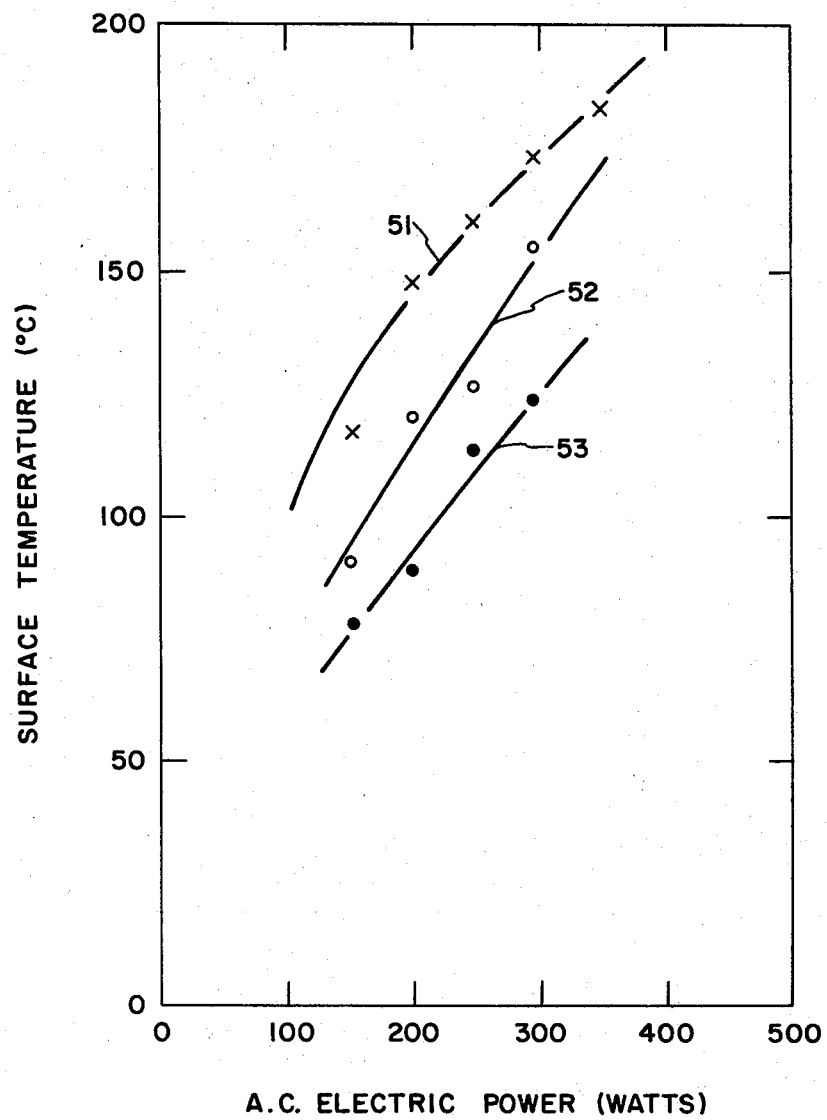
FIG. 3 is a graphical representation for describing a temperature characteristic of the plasma device illustrated in FIG. 2.

Referring to FIG. 3, the reactive sputter etching device illustrated in FIG. 2 is compared in a temperature characteristic with a conventional etching device in which each sample is directly brought into contact with an electrode member without any support member. In FIG. 3, the abscissa represents a.c. electric power (Watts) consumed in both of the etching devices while the ordinate, surface temperatures (°C.) of samples which are etched by both devices. Silicon wafers covered with an aluminum layer have been used as the samples 15. The first electrode members 11 were cooled by water of about 20° C.

A curve 51 shows a temperature characteristic of the conventional etching device. As depicted at the curve 51, the surface temperature of the wafer exceeds 100° C. even when the a.c. electric power is as low as 100 Watts.

It is mentioned here that the aluminum layer of each wafer is selectively covered with a photoresist layer in practical use and that the photoresist layer is subjected to thermal damage when it is heated over 110° C.

Considering the photoresist layer coated on the aluminium layer, the conventional etching device should etch the aluminium by the a.c. electric power less than 120 Watts. Otherwise, the thermal damage inevitably occurs in the photoresist layer. Futhermore, it is difficult with the conventional device to raise an etch rate of the aluminium layer. This is because the etch rate is dependent on the a.c. electric power.

In addition, the temperature characteristic depicted at the curve 51 is widely varied. The characteristic is found to be also varied, depending on etching conditions and etching positions at which the samples are placed. Reproducibility of etching is bad with the conventional device.

Curves 52 and 53 show those temperature characteristics of the etching device illustrating in FIG. 2, which have been measured with the conductor 33 supplied with the d.c. voltages of 900 volts and 1500 volts, respectively. It is readily understood from the curve 52 that the etching device illustrated in FIG. 2 can etch the samples without the thermal damage of the samples, with the conductor 33 kept at 900 volts, even when the a.c. electric power is augmented up to 200 Watts. Augmentation of the a.c. electric power results in a high etch rate. Inasmuch as an etch rate is usually proportional to a.c. electric power, the etch rate of the etching device illustrated in FIG. 2 is about 1.7 times as high as that of the conventional device.

Moreover, the wafer is firmly attracted to the support member and, as a result, thermal resistance is reduced between the support member and the wafer. Therefore, the temperature characteristic is rarely variable everywhere on the first electrode member. Etching is possible with excellent reproducibility.

As shown by the curve 53, the temperature characteristic is further improved when the d.c. voltage is raised up to 1500 volts.

Specifically, the surface temperature does not exceed 110° C. until the a.c. electric power reaches about 260 Watts. This means that the samples can be etched without the thermal damage of the photoresist layer up to 260 Watts. Thus, the etch rate of the etching device illustrated in FIG. 2 is 2.2 times as high as that of the conventional device.

While this invention has thus far been described in conjunction with a preferred embodiment thereof, it is readily possible for those skilled in the art to practice this invention in various manners. For example, the plasma device may be a sputtering device, a plasma chemical vapor deposition device, an ion etching device, or the like. A particular one or ones of the conductors 33 may be supplied with a d.c. voltage different from that of the remaining conductors. Instead of the cooling member, a heater may be embedded in the first electrode member to control a temperature of the samples. A single sample alone may be processed on the first electrode member. The d.c. voltage may be varied, if it is not lower than the negative potential induced on the second support surface by the plasma. Preferably, the d.c. voltage is varied between 0 and 200 volts.

What is claimed is:

1. In a plasma device for processing a sample by the use of plasma, comprising a chamber defining a hollow space therein, a first flat electrode member placed in said hollow space and having a first electrode surface, a second flat electrode member placed in said hollow space and having a second electrode surface directed towards said first electrode surface, support means having a first support surface to be brought into contact with said first electrode surface and a second support surface directed towards said second electrode surface for supporting said sample on said second support surface, a.c. voltage providing means for providing an a.c. voltage between said first and said second electrode members to produce said plasma between said first electrode member with said support means and said second electrode member, d.c. voltage producing means for producing a d.c. voltage to electrostatically couple said sample to said support means during production of said plasma and thereby to fixedly attach said sample to said second support surface, the improvement wherein:

said second means comprises:

a first dielectric layer defining said first support surface;

a conductor placed on said first dielectric layer out of contact with said first electrode surface and electrically connected to said d.c. voltage producing means, with said first electrode member electrically insulated fron said d.c. voltage producing means; and a second dielectric layer covered on said conductor and defining said second support surface to which said sample is to be attached.

2. A plasma device as claimed in claim 1, further comprising insulating means laid internally of said first electrode member and extended to said conductor through said first dielectric layer for electrically insulating said d.c. voltage producing means from said first electrode member to connect said d.c. voltage producing means to said conductor out of contact with said first electrode member.

3. A plasma device as claimed in claim 2, wherein said second support surface is substantially equal in size to said sample.

4. A plasma device as claimed in claim 3, further comprising temperature control means buried in said first electrode member for controlling a temperature of said first electrode member.

5. A plasma device as claimed in claim 4, said temperature control means being for cooling said first electrode member by the use of a predetermined coolant, wherein said temperature control means comprises a conduit extended in said first electrode member for allowing said coolant to flow therethrough.

6. A plasma device as claimed in claim 4, wherein said temperature control means comprises a heater for heating said first electrode member.

7. A plasma device as claimed in any one of claims 1 through 6, further comprising at least one of additional supporting means on said first electrode surface, said additional supporting means comprising structural elements corresponding to those of said supporting means recited in claim 1.

8. A plasma device as claimed in any one of claims 1 through 6 wherein said first dielectric layer is of epoxy resin including a ceramic filler.

9. A plasma device as claimed in any one of claims 1 through 6, wherein said second dielectric layer comprises a film of a pressure sensitive adhesive which provides said second support surface.

10. A plasma device as claimed in any one of claims 1 through 6, wherein said second dielectric layer comprises a coated film of a high molecular material selected from a group consisting of polyimide resin, silicone rubber, and epoxy resin.

11. A plasma device as claimed in claim 10, wherein said coated film includes a filler in addition to said high polymer material.

12. A plasma device as claimed in any one of claims 1 through 6, wherein said conductor is of a metal, each of said first and said second dielectric layers being of an oxide of said metal.

13. A plasma device as claimed in any one of claims 1 through 6, wherein each of said first and said second dielectric layers is of a material selected from a group consisting of ceramic, glass, and plastic.

14. A plasma device as claimed in any one of claims 1 through 6, wherein each of said first and said second dielectric layers is of a sprayed metal oxide.

* * * * *